(12) United States Patent
Cai

(10) Patent No.: US 12,002,431 B2
(45) Date of Patent: Jun. 4, 2024

(54) 3D DISPLAY SYSTEM AND DISPLAY METHOD THEREOF

(71) Applicant: WUHAN CHINA STAR OPTOELECTRONICS TECHNOLOGY CO., LTD., Hubei (CN)

(72) Inventor: Zhenfei Cai, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/607,717

(22) PCT Filed: Aug. 9, 2021

(86) PCT No.: PCT/CN2021/111412
§ 371 (c)(1),
(2) Date: Oct. 29, 2021

(87) PCT Pub. No.: WO2023/284044
PCT Pub. Date: Jan. 19, 2023

(65) Prior Publication Data
US 2024/0029669 A1 Jan. 25, 2024

(30) Foreign Application Priority Data
Jul. 15, 2021 (CN) .......................... 202110799554.2

(51) Int. Cl.
*G09G 3/34* (2006.01)
*G02B 30/23* (2020.01)
(Continued)

(52) U.S. Cl.
CPC ........... *G09G 3/3413* (2013.01); *G02B 30/23* (2020.01); *G02B 30/24* (2020.01); *G09G 3/32* (2013.01);
(Continued)

(58) Field of Classification Search
CPC ...... G09G 3/3413; G09G 3/32; G09G 3/3426; G09G 3/36; G09G 2320/0666; G02B 30/23; G02B 30/24; H01L 25/167
See application file for complete search history.

(56) References Cited

U.S. PATENT DOCUMENTS

| 5,963,371 | A | * | 10/1999 | Needham | ............... | G02B 30/25 |
| | | | | | | 359/464 |
| 8,587,736 | B2 | * | 11/2013 | Kang | ................... | H04N 13/398 |
| | | | | | | 349/98 |

(Continued)

FOREIGN PATENT DOCUMENTS

| CN | 101852920 A | 10/2010 |
| CN | 102685538 A | 9/2012 |
| CN | 104534358 A | 4/2015 |

OTHER PUBLICATIONS

Chinese Office Action in corresponding Chinese Patent Application No. 202110799554.2 dated Jan. 5, 2022, pp. 1-9.

*Primary Examiner* — Vinh T Lam
(74) *Attorney, Agent, or Firm* — PV IP PC; Wei Te Chung; Zhigang Ma

(57) ABSTRACT

The present disclosure provides a three-dimensional (3D) display system and a display method of the 3D display system. The 3D display system includes a display device and 3D glasses, the display device includes a plurality of first micro light emitting diodes, a plurality of second micro light emitting diodes, and a plurality of third micro light emitting diodes which are uniformly distributed. The 3D glasses include a first lens and a second lens. The first micro light (Continued)

emitting diodes and the second micro light emitting diodes are alternately turned on, the third micro light emitting diodes are turned off, or the third micro light emitting diodes and the second micro light emitting diodes are simultaneously turned on.

20 Claims, 3 Drawing Sheets

(51) Int. Cl.
    *G02B 30/24*     (2020.01)
    *G09G 3/32*     (2016.01)
    *G09G 3/36*     (2006.01)
    *H01L 25/16*     (2023.01)

(52) U.S. Cl.
    CPC ............ *G09G 3/3426* (2013.01); *G09G 3/36* (2013.01); *H01L 25/167* (2013.01); *G09G 2320/0666* (2013.01)

(56) References Cited

U.S. PATENT DOCUMENTS

| | | | | |
|---|---|---|---|---|
| 8,619,205 B2* | 12/2013 | Sakai | ............... | H04N 13/341 349/15 |
| 8,692,855 B2* | 4/2014 | Wan | ............... | G09G 3/36 345/697 |
| 8,982,193 B2* | 3/2015 | Cho | ............... | G02B 30/24 348/51 |
| 9,024,982 B2* | 5/2015 | Higashi | ............... | G09G 3/3648 345/204 |
| 9,100,644 B2* | 8/2015 | Seo | ............... | H04N 13/341 |
| 9,116,360 B2* | 8/2015 | Kim | ............... | G02B 30/24 |
| 9,118,910 B2* | 8/2015 | Mizoguchi | ............... | H04N 13/341 |
| 9,217,876 B2* | 12/2015 | Karakawa | ............... | H04N 13/334 |
| 9,335,541 B2* | 5/2016 | Silverstein | ............... | H04N 13/334 |
| 9,720,235 B2* | 8/2017 | Border | ............... | G02B 27/017 |
| 9,740,012 B2* | 8/2017 | Border | ............... | G02B 7/08 |
| 9,971,156 B2* | 5/2018 | Border | ............... | G02B 7/08 |
| 9,986,228 B2* | 5/2018 | Woods | ............... | G02B 27/0093 |
| 10,009,601 B2* | 6/2018 | Horiguchi | ............... | H04N 13/341 |
| 10,012,840 B2* | 7/2018 | Border | ............... | G06F 3/013 |
| 10,191,284 B2* | 1/2019 | Border | ............... | G02B 7/08 |
| 10,210,827 B2* | 2/2019 | Xu | ............... | G09G 3/3648 |
| 11,683,473 B2* | 6/2023 | Richards | ............... | H04N 13/363 348/40 |
| 2012/0229532 A1* | 9/2012 | Chen | ............... | G09G 3/32 345/697 |
| 2012/0281026 A1* | 11/2012 | Atkins | ............... | H04N 13/324 345/690 |
| 2015/0049133 A1* | 2/2015 | Choi | ............... | H04N 13/356 345/76 |
| 2016/0147063 A1* | 5/2016 | Border | ............... | G09G 3/2003 345/592 |
| 2017/0272732 A1* | 9/2017 | Bailey | ............... | H04N 13/334 |

* cited by examiner

A 3D display system is provided, the 3D display system includes a display device and 3D glasses, the display device includes a display panel and a backlight module disposed below the display panel, the backlight module includes a plurality of first micro light emitting diodes, a plurality of second micro light emitting diodes, and a plurality of third micro light emitting diodes which are uniformly distributed; the 3D glasses includes a first lens and a second lens, a color of the first lens is same as a light emitting color of the first micro light emitting diodes, and a color of the second lens is same as a light emitting color of the second micro light emitting diodes, or the color of the second lens is same as a mixed light emitting color of the second micro light emitting diodes and the third micro light emitting diodes — S1

Lighting the first micro light emitting diodes — S2

Lighting the second micro light emitting diodes when the color of the second lens is same as the light emitting color of the second micro light emitting diodes, and lighting the second micro light emitting diodes and the third micro light emitting diodes simultaneously when the color of the second lens is same as the mixed light emitting color of the second micro light emitting diodes and the third micro light emitting diodes — S3

Repeating the step S2 and the step S3 in turn until display ends — S4

FIG. 3

3D DISPLAY SYSTEM AND DISPLAY METHOD THEREOF

RELATED APPLICATIONS

This application is a Notional Phase of PCT Patent Application No. PCT/CN2021/111412 having international filing date of Aug. 9, 2021, which claims the benefit of priority of Chinese Patent Application No. 202110799554.2 filed on Jul. 15, 2021. The contents of the above applications are all incorporated by reference as if fully set forth herein in their entirety.

TECHNICAL FIELD

The present disclosure relates to a field of display technology, and more particularly to a three-dimensional (3D) display system and a display method of the 3D display system.

BACKGROUND

There are many types of 3D displays, one of which is chromatic aberration 3D display. An imaging principle of a chromatic aberration 3D display technology uses two different colors to print images taken from two different viewing angles in a same picture, and may also be referred to as a color separation stereoscopic imaging technology.

If a 3D effect is desired to be viewed, corresponding 3D glasses such as red-cyan 3D glasses, red-blue 3D glasses, etc. need to be used for viewing, otherwise the images viewed by naked eyes are ghosted and fuzzy. Taking the red-cyan 3D glasses as an example, red images pass through a red lens (a bottom color of the red lens is red, so red in the images is filtered, that is, the red lens can only distinguish images other than red), cyan images pass through a cyan lens (a bottom color of the cyan lens is cyan, so cyan in the images is filtered, that is, the cyan lens can only distinguish images other than cyan), that is, two lenses of the red-cyan 3D glasses respectively filter two colors of red and cyan, and then a brain is able to overlap different images from two eyes, so that a 3D stereoscopic effect is appeared, and disadvantages of the red-cyan 3D glasses are that resolution is low and color offsets are easily generated at edges of pictures, so that a 3D experience effect of viewers is poor, and long-term viewing easily causes vertigo. Therefore, it is necessary to improve the disadvantages.

SUMMARY

The present disclosure provides a 3D display system, which is used to solve technical problems that resolution of chromatic aberration 3D display in the prior art is low and color offsets are easily generated at edges of pictures, so that a 3D experience effect of viewers is poor, and long-term viewing easily causes vertigo.

Embodiments of the present disclosure provide the 3D display system, the 3D display system includes a display device and 3D glasses, the display device includes a display panel and a backlight module disposed below the display panel, the backlight module includes a plurality of first micro light emitting diodes, a plurality of second micro light emitting diodes, and a plurality of third micro light emitting diodes which are uniformly distributed. The 3D glasses include a first lens and a second lens, a color of the first lens is same as a light emitting color of the first micro light emitting diodes, and a color of the second lens is same as a light emitting color of the second micro light emitting diodes, or the color of the second lens is same as a mixed light emitting color of the second micro light emitting diodes and the third micro light emitting diodes. The first micro light emitting diodes and the second micro light emitting diodes are alternately turned on, when the color of the second lens is same as the light emitting color of the second micro light emitting diodes, the third micro light emitting diodes are turned off, when the color of the second lens is same as the mixed light emitting color of the second micro light emitting diodes and the third micro light emitting diodes, the third micro light emitting diodes and the second micro light emitting diodes are simultaneously turned on.

In the 3D display system provided by the embodiments of the present disclosure, light emitting colors of the first micro light emitting diodes, the second micro light emitting diodes, and the third micro light emitting diodes are respectively selected from one of red, green, and blue.

In the 3D display system provided by the embodiments of the present disclosure, the light emitting colors of the first micro light emitting diodes, the second micro light emitting diodes, and the third micro light emitting diodes are red, blue, and green respectively.

In the 3D display system provided by the embodiments of the present disclosure, in odd frames, the first micro light emitting diodes are turned on. In even frames, the second micro light emitting diodes are turned on, or the third micro light emitting diodes and the second micro light emitting diodes are simultaneously turned on.

In the 3D display system provided by the embodiments of the present disclosure, each of the first lens and the second lens is a liquid crystal screen, and the liquid crystal screen is able to be controlled to switch between a light transmitting state and a light shielding state.

In the 3D display system provided by the embodiments of the present disclosure, when the first micro light emitting diodes are turned on, the first lens is in the light transmitting state, and the second lens is in the light shielding state, when the second micro light emitting diodes are turned on, or the third micro light emitting diodes and the second micro light emitting diodes are simultaneously turned on, the first lens is in the light shielding state, and the second lens is in the light-transmitting state.

In the 3D display system provided by the embodiments of the present disclosure, the first lens and the second lens are passive color filter 3D glasses.

In the 3D display system provided by the embodiments of the present disclosure, in even frames, the first micro light emitting diodes are turn on, in odd frames, the second micro light emitting diodes are turned on, or the third micro light emitting diodes and the second micro light emitting diodes are simultaneously turned on.

In the 3D display system provided by the embodiments of the present disclosure, the display device further includes a synchronization signal transmitter disposed on the backlight module, a synchronization signal receiver is disposed on the 3D glasses, and the synchronization signal receiver is configured to receive synchronization signals sent by the synchronization signal transmitter.

In the 3D display system provided by the embodiments of the present disclosure, the synchronization signal transmitter is an infrared signal transmitter, and the synchronization signal receiver is an infrared signal receiver.

In the 3D display system provided by the embodiments of the present disclosure, the display device further includes a driving circuit board electrically connected to the display panel, a Bluetooth module is disposed on the driving circuit board, and a Bluetooth receiving module is disposed on the 3D glasses.

In the 3D display system provided by the embodiments of the present disclosure, the backlight module further includes a substrate, a thin film transistor (TFT) array layer, and a transparent glue layer, the TFT array layer is disposed on a side of the substrate facing the display panel, and the plurality of first micro light emitting diodes, the plurality of second micro light emitting diodes, and the plurality of third micro light emitting diodes are disposed on a side of the TFT array layer away from the substrate, and the transparent glue layer is disposed on the side of the substrate facing the display panel and covers the plurality of first micro light emitting diodes, the plurality of second micro light emitting diodes, and the plurality of third micro light emitting diodes, wherein the TFT array layer includes a plurality of TFTs, and any one of the TFTs correspondingly drives one of the first micro light emitting diodes, or one of the second micro light emitting diodes, or one of the third micro light emitting diodes.

The embodiments of the present disclosure provide a display method of a 3D display system, and the display method includes steps of:

S1: providing the 3D display system, the 3D display system includes a display device and 3D glasses, the display device includes a display panel and a backlight module disposed below the display panel, the backlight module includes a plurality of first micro light emitting diodes, a plurality of second micro light emitting diodes, and a plurality of third micro light emitting diodes which are uniformly distributed, the 3D glasses include a first lens and a second lens, a color of the first lens is same as a light emitting color of the first micro light emitting diodes, and a color of the second lens is same as a light emitting color of the second micro light emitting diodes, or the color of the second lens is same as a mixed light emitting color of the second micro light emitting diodes and the third micro light emitting diodes.

S2: lighting the first micro light emitting diodes.

S3: lighting the second micro light emitting diodes when the color of the second lens is same as the light emitting color of the second micro light emitting diodes, and lighting the second micro light emitting diodes and the third micro light emitting diodes simultaneously when the color of the second lens is same as the mixed light emitting color of the second micro light emitting diodes and the third micro light emitting diodes.

S4: repeating the step S2 and the step S3 in turn until display ends.

In the display method of the 3D display system provided by the embodiments of the present disclosure, a sequence of the step S2 and the step S3 are able to be interchanged.

In the display method of the 3D display system provided by the embodiments of the present disclosure, the light emitting colors of the first micro light emitting diodes, the second micro light emitting diodes, and the third micro light emitting diodes are respectively selected from one of red, green, and blue.

In the display method of the 3D display system provided by the embodiments of the present disclosure, the light emitting colors of the first micro light emitting diodes, the second micro light emitting diodes, and the third micro light emitting diodes are red, blue, and green respectively.

In the display method of the 3D display system provided by the embodiments of the present disclosure, each of the first lens and the second lens is a liquid crystal screen, and the liquid crystal screen is able to be controlled to switch between a light transmitting state and a light shielding state.

In the display method of the 3D display system provided by the embodiments of the present disclosure, in the step S2, the first micro light emitting diodes are lit to display odd frames, the first lens is controlled to be in the light transmitting state, and the second lens is controlled to be in the light shielding state. In the step S3, the second micro light emitting diodes are lit, or the second micro light emitting diodes and the third micro light emitting diodes are simultaneously lit to display even frames, and the first lens the is controlled to be in the light shielding state, and the second lens is controlled to be in the light transmitting state.

In the display method of the 3D display system provided by the embodiments of the present disclosure, the first lens and the second lens are passive color filter 3D glasses.

In the display method of the 3D display system provided by the embodiments of the present disclosure, the display device further includes a synchronization signal transmitter disposed on the backlight module, a synchronization signal receiver is disposed on the 3D glasses, and the synchronization signal receiver is configured to receive synchronization signals sent by the synchronization signal transmitter.

The present disclosure provides the 3D display system, the 3D display system includes the display device and the 3D glasses, the display device includes the display panel and the backlight module disposed below the display panel, the backlight module includes a plurality of first micro light emitting diodes, a plurality of second micro light emitting diodes, and a plurality of third micro light emitting diodes which are uniformly distributed. The 3D glasses include the first lens and the second lens, the color of the first lens is same as the light emitting color of the first micro light emitting diodes, and the color of the second lens is same as the light emitting color of the second micro light emitting diodes, or the color of the second lens is same as a mixed light emitting color of the second micro light emitting diodes and the third micro light emitting diodes. The first micro light emitting diodes and the second micro light emitting diodes are alternately turned on, when the color of the second lens is same as the light emitting color of the second micro light emitting diodes, the third micro light emitting diodes are turned off, when the color of the second lens is same as the mixed light emitting color of the second micro light emitting diodes and the third micro light emitting diodes, the third micro light emitting diodes and the second micro light emitting diodes are simultaneously turned on. In the present disclosure, by controlling the first micro light emitting diodes and the second micro light emitting diodes on the backlight module to be alternately turned on, and controlling the third micro light emitting diodes to be turned off, or the third micro light emitting diodes and the second micro light emitting diodes to be simultaneously turned on, a combined use of chromatic aberration 3D and shutter 3D is realized on basis of not reducing the resolution of display screens, and the 3D experience effect of users is improved.

DESCRIPTION OF DRAWINGS

FIG. 3 is a flowchart of a display method of a 3D display system provided by an embodiment of present disclosure.

DETAILED DESCRIPTION OF PREFERRED EMBODIMENTS

Figure 1:
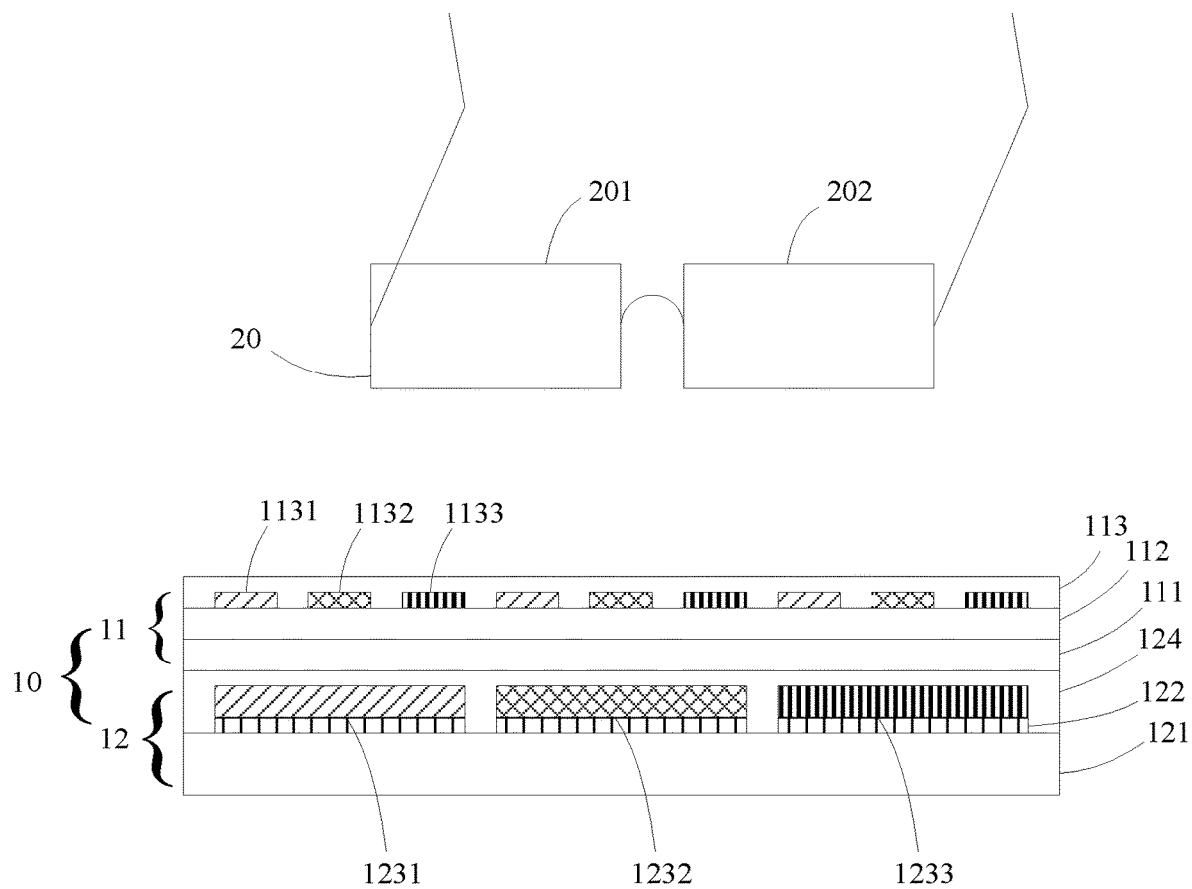
FIG. 1 is a basic schematic structural diagram of a 3D display system provided by an embodiment of present disclosure.

In order to make objectives, technical solutions, and effects of the present disclosure clearer, the present disclosure is further described in detail below with reference to accompanying drawings and embodiments. In the drawings, the dimensions and thicknesses of the components illustrated in the drawings are not to scale for clarity and ease of understanding and description.

As shown in FIG. 1, a basic schematic structural diagram of a 3D display system is provided by an embodiment of present disclosure. The 3D display system includes a display device 10 and 3D glasses 20, the display device 10 includes a display panel 11 and a backlight module 12 disposed below the display panel 11, the backlight module 12 includes a plurality of first micro light emitting diodes 1231, a plurality of second micro light emitting diodes 1232, and a plurality of third micro light emitting diodes 1233 which are uniformly distributed. The 3D glasses 20 include a first lens 201 and a second lens 202, a color of the first lens 201 is same as a light emitting color of the first micro light emitting diodes 1231, and a color of the second lens 202 is same as a light emitting color of the second micro light emitting diodes 1232, or the color of the second lens 202 is same as a mixed light emitting color of the second micro light emitting diodes 1232 and the third micro light emitting diodes 1233.

The first micro light emitting diodes 1231 and the second micro light emitting diodes 1232 are alternately turned on, when the color of the second lens 202 is same as the light emitting color of the second micro light emitting diodes 1232, the third micro light emitting diodes 1233 are turned off, when the color of the second lens 202 is same as the mixed light emitting color of the second micro light emitting diodes 1232 and the third micro light emitting diodes 1233, the third micro light emitting diodes 1233 and the second micro light emitting diodes 1232 are simultaneously turned on.

It's understandable that the 3D display system provided by the present disclosure provides backlight with different colors by controlling the first micro light emitting diodes 1231, the second micro light emitting diodes 1232, and the third micro light emitting diodes 1233 on the backlight module to work in a time-sharing manner. Specifically, there are the following two cases: the first case is that the first micro light emitting diodes 1231 and the second micro light emitting diodes 1232 are alternately turned on, and the third micro light emitting diodes 1233 are turned off, then images displayed on the display panel 11 are determined by the light emitting colors of the first micro light emitting diodes 1231 and the second micro light emitting diodes 1232 respectively. When the first micro light emitting diodes 1231 are turned on, the first lens 201 is able to distinguish colors other than the light emitting color of the first micro light emitting diodes 1231, that is, the images emitted by the first micro light emitting diodes 1231 are able to be seen through the first lens 201. When the second micro light emitting diodes 1232 are turned on, the second lens 202 is able to distinguish colors other than the light emitting color of the second micro light emitting diodes 1232, that is, the images emitted by the second micro light emitting diodes 1232 are able to be seen through the second lens 202. When a refresh rate of the display panel 11 is greater than or equal to 120 hertz, due to parallax of two eyes and a visual persistence effect, the two images are combined into one picture with depth of field in the brain, that is, the 3D stereoscopic effect is able to be viewed, so the combined use of chromatic aberration 3D and shutter 3D is realized. Since the first micro light emitting diodes 1231 and the second micro light emitting diodes 1232 are uniformly distributed below the display panel 11, no matter viewers view from a middle region or an edge region, the color offsets are not generated, and the 3D experience effect of users is improved.

The second case is that the first micro light emitting diodes 1231 and the second micro light emitting diodes 1232 are alternately turned on, and the third micro light emitting diodes 1233 and the second micro light emitting diodes 1232 are simultaneously turned on, then the images displayed on the display panel 11 are determined by the light emitting color of the first micro light emitting diodes 1231 and the mixed light emitting color of the second micro light emitting diodes 1232 and the third micro light emitting diodes 1233 respectively. When the first micro light emitting diodes 1231 are turned on, the first lens 201 is able to distinguish colors other than the light emitting color of the first micro light emitting diodes 1231, that is, the images emitted by the first micro light emitting diodes 1231 are able to be viewed through the first lens 201. When the second micro light emitting diodes 1232 and the third micro light emitting diodes 1233 are simultaneously turned on, the second lens 202 is able to distinguish colors other than the mixed light emitting color of the second micro light emitting diodes 1232 and the third micro light emitting diodes 1233, that is, the images co-emitted by the second micro light emitting diodes 1232 and the third micro light emitting diodes 1233 are able to be viewed through the second lens 202. A display principle of the second case is similar to the first case, and details are not described again.

In one embodiment, light emitting colors of the first micro light emitting diodes 1231, the second micro light emitting diodes 1232, and the third micro light emitting diodes 1233 are respectively selected from one of red, green, and blue. It's understandable that since the light emitting colors of the first micro light emitting diodes 1231, the second micro light emitting diodes 1232, and the third micro light emitting diodes 1233 are different, when the light emitting color of the first micro light emitting diodes 1231 is red, the light emitting color of the second micro light emitting diodes 1232 is green, then the light emitting color of the third micro light emitting diodes 1233 is blue. In other embodiments, the light emitting colors of the first micro light emitting diodes 1231, the second micro light emitting diodes 1232, and the third micro light emitting diodes 1233 may also be red, blue, green, or green, red, blue, or green, blue, red, or blue, red, green, or blue, green, red.

In the embodiments of the present disclosure, as an example for description, the light emitting colors of the first micro light emitting diodes 1231, the second micro light emitting diodes 1232, and the third micro light emitting diodes 1233 are respectively red, blue, and green, and other similar cases are not described again. It's understandable that when the light emitting colors of the first micro light emitting diodes 1231, the second micro light emitting diodes 1232, and the third micro light emitting diodes 1233 are red, blue, and green respectively, the color of the first lens 201 is red, and the color of the second lens 202 is blue or cyan (that is, a mixed color of blue and green).

In one embodiment, the backlight module 12 further includes a substrate 121, a thin film transistor (TFT) array layer 122, and a transparent glue layer 124. The TFT array layer 122 is disposed on a side of the substrate 121 facing the display panel 11, and the plurality of first micro light emitting diodes 1231, the plurality of second micro light emitting diodes 1232, and the plurality of third micro light emitting diodes 1233 are disposed on a side of the TFT array layer 122 away from the substrate 121, and the transparent glue layer 124 is disposed on the side of the substrate 121 facing the display panel 11 and covers the plurality of first micro light emitting diodes 1231, the plurality of second micro light emitting diodes 1232, and the plurality of third micro light emitting diodes 1233.

The TFT array layer 122 includes a plurality of TFTs, and any one of the TFTs correspondingly drives one of the first micro light emitting diodes 1231, or one of the second micro light emitting diodes 1232, or one of the third micro light emitting diodes 1233. That is, the first micro light emitting diodes 1231, the second micro light emitting diodes 1232, and the third micro light emitting diodes 1233 all actively emit light, and the first micro light emitting diodes 1231, the second micro light emitting diodes 1232, and the third micro light emitting diodes 1233 are able to be controlled to turn on and turn off respectively by a peripheral driving circuit. The transparent glue layer 124 is configured to protect the first micro light emitting diodes 1231, the second micro light emitting diodes 1232, and the third micro light emitting diodes 1233, so as to improve a service life of the display device 10.

In one embodiment, the display panel 11 includes an array substrate 111, a color filter substrate 113, and a liquid crystal molecular layer 112 sandwiched between the array substrate 111 and the color filter substrate 113, wherein a plurality of color resists are disposed on the color filter substrate 113, the color resists include a plurality of red color resists 1131, a plurality of blue color resists 1132, and a plurality of green color resists 1133.

In one embodiment, in odd frames, the first micro light emitting diodes 1231 are turned on, in even frames, the second micro light emitting diodes 1232 are turned on, or the third micro light emitting diodes 1233 and the second micro light emitting diodes 1232 are simultaneously turned on. It should be noted that the odd frames and the even frames may be interchanged, that is, in another embodiment, in the even frames, the first micro light emitting diodes 1231 are turned on, in the odd frames, the second micro light emitting diodes 1232 are turned on, or the third micro light emitting diodes 1233 and the second micro light emitting diodes 1232 are simultaneously turned on. It's understandable that, in the embodiments of the present disclosure, each of images is divided into two images by frame, that is, each image is divided into odd frames and even frames to form two sets of pictures corresponding to a left eye and a right eye, which are displayed continuously and interlaced to maintain original resolution of the pictures, so that users are able to feel the 3D effect easily, and brightness of the pictures is not reduced.

Specifically, each of original 2D pictures is divided into two images displayed in the odd frames and the even frames, and the two images are processed by frame through depth of field to form two pictures corresponding to the left eye and the right eye. When a 3D slice source is played, the pictures corresponding to the left eye and the right eye are played alternately and continuously, and the brain comprehensively processes images formed on a left eye retina and a right eye retina, so that a 3D stereoscopic effect is able to be generated.

In one embodiment, each of the first lens 201 and the second lens 202 is a liquid crystal screen, and the liquid crystal screen is able to be controlled to switch between a light transmitting state and a light shielding state. Specifically, the first lens 201 and the second lens 202 are composed of a liquid crystal screen having only opening and close states, when a lens is not energized, the lens is opened to transmit light, and when the lens is energized, the lens is closed without light transmission. It should be noted that the present disclosure improves a liquid crystal response time of the 3D glasses, thereby increasing a steady state time of the lens opening, and an opening time of backlight may be appropriately increased, so that brightness of the pictures viewed by wearing the 3D glasses is improve, thereby improving the 3D experience effect of the users. In other embodiment, the first lens 201 and the second lens 202 can also be passive color filter 3D glasses.

In one embodiment, when the first micro light emitting diodes 1231 are turned on, the first lens 201 is in the light transmitting state, and the second lens 202 is in the light shielding state. When the second micro light emitting diodes 1232 are turned on, or the third micro light emitting diodes 1233 and the second micro light emitting diodes 1232 are simultaneously turned on, the first lens 201 is in the light shielding state, and the second lens 202 is in the light transmitting state.

It's understandable that the first lens 201 correspondingly receives the images emitted by the first micro light emitting diodes 1231, and the first micro light emitting diodes 1231 correspondingly emit the images of the odd frames, that is, in the odd frames, the display panel 11 displays the images corresponding to the odd frames, and at the same time, the first micro light emitting diodes 1231 on the backlight module 12 are lit, in the corresponding 3D glasses 20, the liquid crystal screen of the first lens 201 is opened, the liquid crystal screen of the second lens 202 is closed, and the left eye correspondingly receives the pictures of the odd frames.

It is understandable that the second lens 202 correspondingly receives the images emitted by the second micro light emitting diodes 1232, or the images co-emitted by the second micro light emitting diodes 1232 and the third micro light emitting diodes 1233, and the second micro light emitting diodes 1232, or the second micro light emitting diodes 1233 and the third micro light emitting diodes 1233 correspondingly emit the images of the even frames, that is, in even frames, the display panel 11 displays the images corresponding to the even frames, and the second micro light emitting diodes 1232 on the backlight module 12 are lit, or the second micro light emitting diodes 1232 and the third micro light emitting diodes 1233 are lit simultaneously, in the corresponding 3D glasses 20, the liquid crystal screen of the second lens 202 is opened, the liquid crystal screen of the first lens 201 is closed, and the right eye correspondingly receives the images of the even frames.

In one embodiment, the display device 10 further includes a synchronization signal transmitter (not shown) disposed on the backlight module 12, a synchronization signal receiver is disposed on the 3D glasses 20, and the synchronization signal receiver is configured to receive synchronization signals sent by the synchronization signal transmitter. Specifically, the synchronization signal transmitter is an infrared signal transmitter, and the synchronization signal receiver is an infrared signal receiver.

Specifically, when the display device 10 displays the images of the odd frames, the synchronization signal transmitter transmits a synchronization signal, and after the synchronization signal is received by the synchronization signal receiver, the synchronization signal receiver controls the first lens 201 to open and the second lens 202 to close.

When the display device 10 displays the images of the even frames, the synchronization signal transmitter transmits the synchronization signal, and after the synchronization signal is received by the synchronization signal receiver, the synchronization signal receiver controls the second lens 202 to open and the first lens 201 to close, that is, the synchronization signal transmitter is able to synchronously control opening and closing of the first lens 201 and the second lens 202 of the 3D glasses 20, so that two eyes are able to see corresponding pictures at correct moments.

In one embodiment, the display device 10 further includes a driving circuit board (not shown) electrically connected to the display panel 11, a Bluetooth module (not shown) is disposed on the driving circuit board, and a Bluetooth receiving module (not shown) is disposed on the 3D glasses 20, that is, the display device 10 may further communicate the synchronization signals with the 3D glasses 20 through the Bluetooth module.

Figure 2:
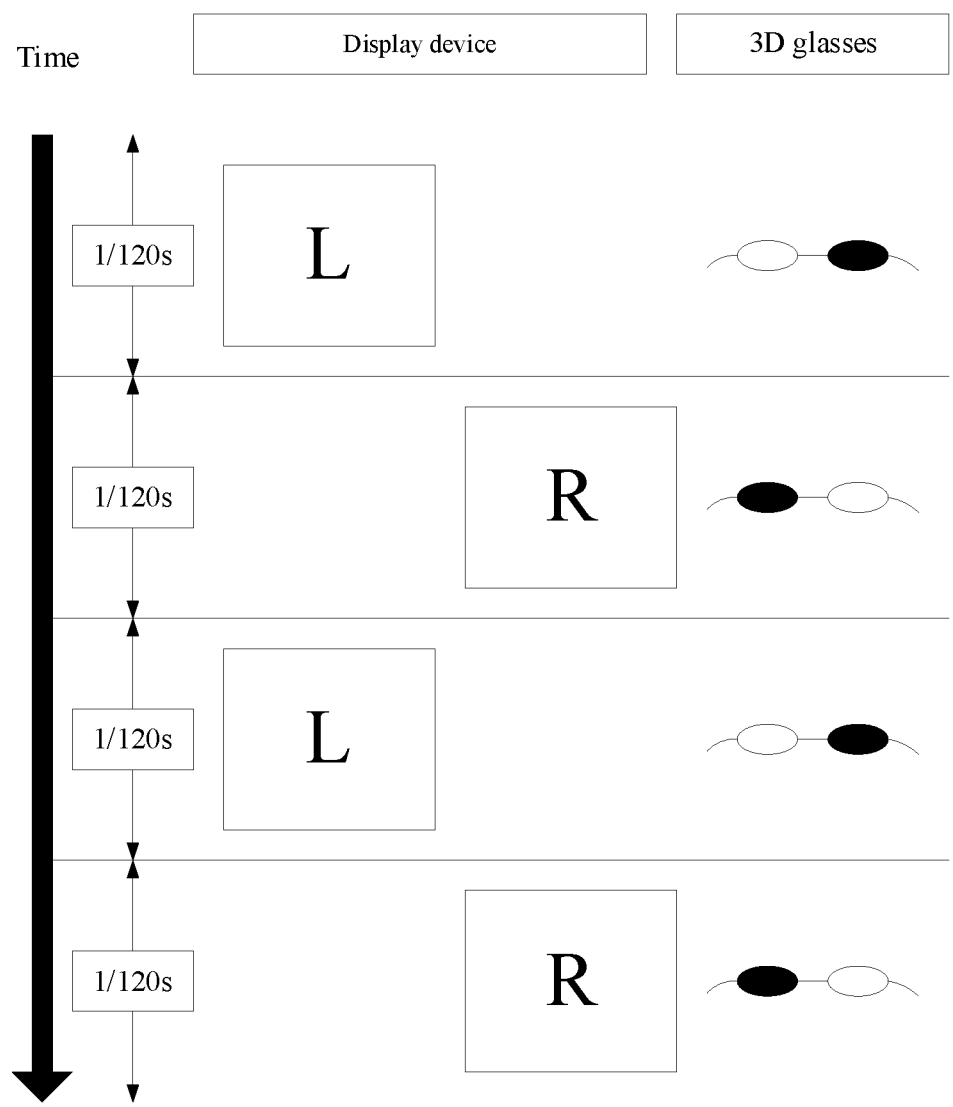
FIG. 2 is a working timing diagram of a 3D display system provided by an embodiment of present disclosure.

Next, please refer to FIG. 2, a working timing diagram of a 3D display system is provided by an embodiment of present disclosure. When a refresh rate of the display device is 120 hertz, the display device is switched every ¹⁄₁₂₀ second, in the odd frames, the images (L) corresponding to the left eye are displayed, and at the same time, a left eye lens of the 3D glasses is opened, and a right eye lens is closed. In the even frames, the images (R) corresponding to the right eye are displayed, and at same time, the left eye lens of the 3D glasses is closed, and the right eye lens is opened, so that correct images are able to be viewed at correct moments. It should be noted that the odd frames and the even frames may be interchanged.

Next, please refer to FIG. 3, a flowchart of a display method of a 3D display system is provided by an embodiment of present disclosure, the display method includes steps of:

S1: providing a 3D display system, the 3D display system includes a display device and 3D glasses, the display device includes a display panel and a backlight module disposed below the display panel, the backlight module includes a plurality of first micro light emitting diodes, a plurality of second micro light emitting diodes, and a plurality of third micro light emitting diodes which are uniformly distributed, the 3D glasses include a first lens and a second lens, a color of the first lens is same as a light emitting color of the first micro light emitting diodes, and a color of the second lens is same as a light emitting color of the second micro light emitting diodes, or the color of the second lens is same as a mixed light emitting color of the second micro light emitting diodes and the third micro light emitting diodes.

S2: lighting the first micro light emitting diodes.

S3: lighting the second micro light emitting diodes when the color of the second lens is same as the light emitting color of the second micro light emitting diodes, and lighting the second micro light emitting diodes and the third micro light emitting diodes simultaneously when the color of the second lens is same as the mixed light emitting color of the second micro light emitting diodes and the third micro light emitting diodes.

S4: repeating the step S2 and the step S3 in turn until display ends.

It should be noted that a sequence of the step S2 and the step S3 are able to be interchanged, that is, the second micro light emitting diodes may also be lit first, or the second micro light emitting diodes and the third micro light emitting diodes may be lit simultaneously first, and then the first micro light emitting diodes are lit.

It's understandable that the 3D display system provided by the present disclosure provides backlight with different colors by controlling the first micro light emitting diodes, the second micro light emitting diodes, and the third micro light emitting diodes on the backlight module to be lit in a time-sharing manner. Specifically, there are the following two cases: the first case is that the color of the second lens is same as the light emitting color of the second micro light emitting diodes, and the images displayed on the display panel are determined by the light emitting color of the first micro light emitting diodes and the second micro light emitting diodes respectively. When the first micro light emitting diodes are lit, the first lens is able to distinguish colors other than the light emitting color of the first micro light emitting diodes, that is, the images emitted by the first micro light emitting diodes are able to be seen through the first lens. When the second micro light emitting diodes are lit, the second lens is able to distinguish colors other than the light emitting color of the second micro light emitting diodes, that is, the images emitted by the second micro light emitting diodes are able to be seen through the second lens. When a refresh rate of the display panel is greater than or equal to 120 hertz, due to parallax of two eyes and a visual persistence effect, the two images are combined into one image with depth of field in a brain, that is, a 3D stereoscopic effect is able to be viewed, and a combined use of a chromatic aberration 3D and a shutter 3D is realized. Since the first micro light emitting diodes and the second micro light emitting diodes are uniformly distributed below the display panel, no matter viewers view from a middle region or an edge region, color offsets are not generated, and the 3D experience effect of users is improved.

The second case is that the color of the second lens is same as the mixed light emitting color of the second micro light emitting diodes and the third micro light emitting diodes, and the images displayed on the display panel are determined by the light emitting color of the first micro light emitting diodes, or the mixed light emitting color of the second micro light emitting diodes and the third micro light emitting diodes. When the first micro light emitting diodes are lit, the first lens is able to distinguish colors other than the light emitting color of the first micro light emitting diodes, that is, the images emitted by the first micro light emitting diodes are able to be seen through the first lens. When the second micro light emitting diodes and the third micro light emitting diodes are simultaneously lit, the second lens is able to distinguish colors other than the mixed light emitting color of the second micro light emitting diodes and the third micro light emitting diodes, that is, the images emitted by the second micro light emitting diodes and the third micro light emitting diodes are able to be seen through the second lens. A display principle of the second case is similar to the first case, and details are not described again.

In one embodiment, the light emitting colors of the first micro light emitting diodes, the second micro light emitting diodes, and the third micro light emitting diodes are respectively selected from one of red, green, and blue. It's understandable that since the light emitting colors of the first micro light emitting diodes, the second micro light emitting diodes, and the third micro light emitting diodes are different, when the light emitting color of the first micro light emitting diodes is red, the light emitting color of the second micro light emitting diodes is green, then the light emitting color of the third micro light emitting diodes is blue. In other embodiments, the light emitting colors of the first micro light emitting diodes, the second micro light emitting diodes, and the third micro light emitting diodes may also be red, blue, green, or green, red, blue, or green, blue, red, or blue, red, green, or blue, green, red.

In one embodiment, each of the first lens and the second lens is a liquid crystal screen, and the liquid crystal screen is able to be controlled to switch between a light transmitting state and a light shielding state. Specifically, the first lens and the second lens are composed of a liquid crystal screen having only opening and close states, when a lens is not energized, the lens is opened to transmit light, and when the lens is energized, the lens is closed without light transmission. In other embodiment, the first lens 201 and the second lens 202 can also be passive color filter 3D glasses.

In one embodiment, in the step S2, the first micro light emitting diodes are lit to display odd frames, the first lens is controlled to be in the light transmitting state, and the second lens is controlled to be in the light shielding state. In the step S3, the second micro light emitting diodes are lit, or the second micro light emitting diodes and the third micro light emitting diodes are simultaneously lit to display even frames, and the first lens the is controlled to be in the light shielding state, and the second lens is controlled to be in the light transmitting state.

It's understandable that the first lens correspondingly receives the images emitted by the first micro light emitting diodes, and the first micro light emitting diodes correspondingly emit the images of the odd frames, that is, in the odd frames, the display panel displays the images corresponding to the odd frames, and at the same time, the first micro light emitting diodes on the backlight module are lit, the liquid crystal screen of the first lens of corresponding 3D glasses is opened, the liquid crystal screen of the second lens is closed, and the left eye correspondingly receives the pictures of the odd frames.

It's understandable that the second lens correspondingly receives the images emitted by the second micro light emitting diodes, or the images co-emitted by the second micro light emitting diodes and the third micro light emitting diodes, and the second micro light emitting diodes, or the second micro light emitting diodes and the third micro light emitting diodes correspondingly emit the images of the even frames, that is, in even frames, the display panel displays the images corresponding to the even frames, and the second micro light emitting diodes on the backlight module are lit, or the second micro light emitting diodes and the third micro light emitting diodes are simultaneously lit, the liquid crystal screen of the second lens of the corresponding 3D glasses is opened, the liquid crystal screen of the first lens is closed, and the right eye correspondingly receives the images of the even frames.

In one embodiment, the display device further includes a synchronization signal transmitter disposed on the backlight module, a synchronization signal receiver is disposed on the 3D glasses, and the synchronization signal receiver is configured to receive synchronization signals sent by the synchronization signal transmitter. Specifically, the synchronization signal transmitter is an infrared signal transmitter, and the synchronization signal receiver is an infrared signal receiver.

Specifically, when the display device displays the images of the odd frames, the synchronization signal transmitter transmits a synchronization signal, and after the synchronization signal is received by the synchronization signal receiver, the synchronization signal receiver controls the first lens to open and the second lens to close. When the display device displays the images of the even frames, the synchronization signal transmitter transmits the synchronization signal, and after the synchronization signal is received by the synchronization signal receiver, the synchronization signal receiver controls the second lens to open and the first lens to close, that is, the synchronization signal transmitter is able to synchronously control the opening and closing of the first lens and the second lens of the 3D glasses, so that two eyes are able to see corresponding pictures at correct moments.

In one embodiment, the display device further includes a driving circuit board electrically connected to the display panel, a Bluetooth module is disposed on the driving circuit board, and a Bluetooth receiving module is disposed on the 3D glasses, that is, the display device may further communicate the synchronization signals with the 3D glasses through the Bluetooth module.

The present disclosure provides the 3D display system, the 3D display system includes the display device and the 3D glasses, the display device includes the display panel and the backlight module disposed below the display panel, the backlight module includes the plurality of first micro light emitting diodes, the plurality of second micro light emitting diodes, and the plurality of third micro light emitting diodes which are uniformly distributed. The 3D glasses include the first lens and the second lens, the color of the first lens is same as the light emitting color of the first micro light emitting diodes, and the color of the second lens is same as the light emitting color of the second micro light emitting diodes, or the color of the second lens is same as the mixed light emitting color of the second micro light emitting diodes and the third micro light emitting diodes. The first micro light emitting diodes and the second micro light emitting diodes are alternately turned on, when the color of the second lens is same as the light emitting color of the second micro light emitting diodes, the third micro light emitting diodes are turned off, when the color of the second lens is same as the mixed light emitting color of the second micro light emitting diodes and the third micro light emitting diodes, the third micro light emitting diodes and the second micro light emitting diodes are simultaneously turned on. In the present disclosure, by controlling the first micro light emitting diodes and the second micro light emitting diodes on the backlight module to be alternately turned on, and controlling the third micro light emitting diodes to be turned off, or the third micro light emitting diodes and the second micro light emitting diodes to be simultaneously turned on, the combined use of the chromatic aberration 3D and the shutter 3D is realized on a basis of not reducing the resolution of display screens, and the 3D experience effect of users is improved, and technical problems that resolution of the chromatic aberration 3D in the prior art is low and color offsets are easily generated at edges of pictures, resulting in poor 3D experience effect of viewers and long-term viewing easily causing vertigo are solved.

In the above embodiments, the description of each embodiment has its own emphasis, for a part that is not detailed in an embodiment, you can refer to the related descriptions of other embodiments.

It's understandable that for those of ordinary skill in the art, equivalent substitutions or changes may be made according to the technical solutions and inventive concepts of the present disclosure, and all these substitutions or changes shall fall within the protection scope of the claims of the present application.

What is claimed is:

1. A three-dimensional (3D) display system, comprising:
a display device, wherein the display device comprises a display panel and a backlight module disposed below the display panel, the backlight module comprises a plurality of first micro light emitting diodes, a plurality of second micro light emitting diodes, and a plurality of third micro light emitting diodes which are uniformly distributed; and
3D glasses, wherein the 3D glasses comprise a first lens and a second lens, a color of the first lens is same as a light emitting color of the first micro light emitting diodes, and a color of the second lens is same as a light emitting color of the second micro light emitting diodes, or the color of the second lens is same as a mixed light emitting color of the second micro light emitting diodes and the third micro light emitting diodes;
wherein the first micro light emitting diodes and the second micro light emitting diodes are alternately turned on, when the color of the second lens is same as the light emitting color of the second micro light emitting diodes, the third micro light emitting diodes are turned off, when the color of the second lens is same as the mixed light emitting color of the second micro light emitting diodes and the third micro light emitting diodes, the third micro light emitting diodes and the second micro light emitting diodes are simultaneously turned on.

2. The 3D display system of claim 1, wherein light emitting colors of the first micro light emitting diodes, the second micro light emitting diodes, and the third micro light emitting diodes are respectively selected from one of red, green, and blue.

3. The 3D display system of claim 2, wherein the light emitting colors of the first micro light emitting diodes, the second micro light emitting diodes, and the third micro light emitting diodes are red, blue, and green respectively.

4. The 3D display system of claim 1, wherein in odd frames, the first micro light emitting diodes are turned on; in even frames, the second micro light emitting diodes are turned on, or the third micro light emitting diodes and the second micro light emitting diodes are simultaneously turned on.

5. The 3D display system of claim 4, wherein each of the first lens and the second lens is a liquid crystal screen, and the liquid crystal screen is able to be controlled to switch between a light transmitting state and a light shielding state.

6. The 3D display system of claim 5, wherein when the first micro light emitting diodes are turned on, the first lens is in the light transmitting state, and the second lens is in the light shielding state; when the second micro light emitting diodes are turned on, or the third micro light emitting diodes and the second micro light emitting diodes are simultaneously turned on, the first lens is in the light shielding state, and the second lens is in the light transmitting state.

7. The 3D display system of claim 4, wherein the first lens and the second lens are passive color filter 3D glasses.

8. The 3D display system of claim 1, wherein in even frames, the first micro light emitting diodes are turn on; in odd frames, the second micro light emitting diodes are turned on, or the third micro light emitting diodes and the second micro light emitting diodes are simultaneously turned on.

9. The 3D display system of claim 1, wherein the display device further comprises a synchronization signal transmitter disposed on the backlight module, a synchronization signal receiver is disposed on the 3D glasses, and the synchronization signal receiver is configured to receive synchronization signals sent by the synchronization signal transmitter.

10. The 3D display system of claim 9, wherein the synchronization signal transmitter is an infrared signal transmitter, and the synchronization signal receiver is an infrared signal receiver.

11. The 3D display system of claim 1, wherein the display device further comprises a driving circuit board electrically connected to the display panel, a Bluetooth module is disposed on the driving circuit board, and a Bluetooth receiving module is disposed on the 3D glasses.

12. The 3D display system of claim 1, wherein the backlight module further comprises a substrate, a thin film transistor (TFT) array layer, and a transparent glue layer; the TFT array layer is disposed on a side of the substrate facing the display panel, and the plurality of first micro light emitting diodes, the plurality of second micro light emitting diodes, and the plurality of third micro light emitting diodes are disposed on a side of the TFT array layer away from the substrate, and the transparent glue layer is disposed on the side of the substrate facing the display panel and covers the plurality of first micro light emitting diodes, the plurality of second micro light emitting diodes, and the plurality of third micro light emitting diodes; wherein the TFT array layer comprises a plurality of TFTs, and any one of the TFTs correspondingly drives one of the first micro light emitting diodes, or one of the second micro light emitting diodes, or one of the third micro light emitting diodes.

13. A display method of a three-dimensional (3D) display system, the display method comprising steps of:
S1: providing the 3D display system, wherein the 3D display system comprises a display device and three-dimensional (3D) glasses, the display device comprises a display panel and a backlight module disposed below the display panel, the backlight module comprises a plurality of first micro light emitting diodes, a plurality of second micro light emitting diodes, and a plurality of third micro light emitting diodes which are uniformly distributed; the 3D glasses comprise a first lens and a second lens, a color of the first lens is same as a light emitting color of the first micro light emitting diodes, and a color of the second lens is same as a light emitting color of the second micro light emitting diodes, or the color of the second lens is same as a mixed light emitting color of the second micro light emitting diodes and the third micro light emitting diodes;
S2: lighting the first micro light emitting diodes;
S3: lighting the second micro light emitting diodes when the color of the second lens is same as the light emitting color of the second micro light emitting diodes, and lighting the second micro light emitting diodes and the third micro light emitting diodes simultaneously when the color of the second lens is same as the mixed light emitting color of the second micro light emitting diodes and the third micro light emitting diodes; and
S4: repeating the step S2 and the step S3 in turn until display ends.

14. The display method of the 3D display system of claim 13, wherein a sequence of the step S2 and the step S3 are able to be interchanged.

15. The display method of the 3D display system of claim 13, wherein the light emitting colors of the first micro light emitting diodes, the second micro light emitting diodes, and the third micro light emitting diodes are respectively selected from one of red, green, and blue.

16. The display method of the 3D display system of claim 15, wherein the light emitting colors of the first micro light emitting diodes, the second micro light emitting diodes, and the third micro light emitting diodes are red, blue, and green respectively.

17. The display method of the 3D display system of claim 13, wherein each of the first lens and the second lens is a liquid crystal screen, and the liquid crystal screen is able to be controlled to switch between a light transmitting state and a light shielding state.

18. The display method of the 3D display system of claim 17, wherein in the step S2, the first micro light emitting diodes are lit to display odd frames, the first lens is controlled to be in the light transmitting state, and the second lens is controlled to be in the light shielding state; in the step S3, the second micro light emitting diodes are lit, or the second micro light emitting diodes and the third micro light emitting diodes are simultaneously lit to display even frames, and the first lens the is controlled to be in the light shielding state, and the second lens is controlled to be in the light transmitting state.

19. The display method of the 3D display system of claim 13, wherein the first lens and the second lens are passive color filter 3D glasses.

20. The display method of the 3D display system of claim 13, wherein the display device further comprises a synchronization signal transmitter disposed on the backlight module, a synchronization signal receiver is disposed on the 3D glasses, and the synchronization signal receiver is configured to receive synchronization signals sent by the synchronization signal transmitter.

* * * * *